(12) United States Patent
Lebonheur et al.

(10) Patent No.: US 7,294,533 B2
(45) Date of Patent: Nov. 13, 2007

(54) MOLD COMPOUND CAP IN A FLIP CHIP MULTI-MATRIX ARRAY PACKAGE AND PROCESS OF MAKING SAME

(75) Inventors: Vassou Lebonheur, Tempe, AZ (US); Richard J. Harries, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 433 days.

(21) Appl. No.: 10/612,764

(22) Filed: Jun. 30, 2003

(65) Prior Publication Data

US 2004/0262776 A1 Dec. 30, 2004

(51) Int. Cl.
*H01L 21/56* (2006.01)

(52) U.S. Cl. .................. 438/127; 29/856; 257/787; 257/E21.503; 257/E21.504

(58) Field of Classification Search ............... 257/685, 257/688, 723, 737, 738, 778, 779, 782, 783, 257/789, 795, 787, E21.503, E21.504; 438/614, 438/108, 127; 29/856
See application file for complete search history.

(56) References Cited

U.S. PATENT DOCUMENTS

| | | | | |
|---|---|---|---|---|
| 5,128,746 | A * | 7/1992 | Pennisi et al. | 257/738 |
| 5,136,365 | A * | 8/1992 | Pennisi et al. | 257/783 |
| 5,218,234 | A | 6/1993 | Thompson et al. | |
| 5,789,820 | A | 8/1998 | Yamashita | |
| 5,817,545 | A | 10/1998 | Wang et al. | |
| 5,874,783 | A | 2/1999 | Yamada et al. | |
| 6,058,021 | A * | 5/2000 | Yamamoto | 361/783 |
| 6,434,017 | B1 * | 8/2002 | Iwabuchi | 361/771 |
| 6,438,826 | B2 * | 8/2002 | Takase et al. | 29/855 |
| 6,461,896 | B1 * | 10/2002 | Imasu et al. | 438/108 |
| 6,531,026 | B1 * | 3/2003 | Takeichi et al. | 156/282 |
| 6,727,583 | B2 * | 4/2004 | Naka et al. | 257/724 |
| 6,737,741 | B2 * | 5/2004 | Imasu et al. | 257/723 |
| 6,903,278 | B2 * | 6/2005 | Sathe | 174/255 |
| 6,919,642 | B2 * | 7/2005 | Hsieh et al. | 257/778 |
| 6,933,173 | B2 * | 8/2005 | Yunus | 438/110 |
| 6,940,182 | B2 * | 9/2005 | Hilton et al. | 257/787 |
| 6,995,476 | B2 * | 2/2006 | Hashimoto | 257/787 |
| 7,138,706 | B2 * | 11/2006 | Arai et al. | 257/678 |
| 2002/0060084 | A1 | 5/2002 | Hilton et al. | |
| 2002/0117762 | A1 | 8/2002 | Ikegami | |
| 2003/0082852 | A1 | 5/2003 | Fang | |

FOREIGN PATENT DOCUMENTS

| | | | |
|---|---|---|---|
| EP | 0740340 A2 | 10/1996 | |
| JP | 2003-283295 | * 3/2003 | 9/25 |
| WO | WO-03050865 A1 | 6/2003 | |
| WO | WO-2005006433 A2 | 1/2005 | |
| WO | WO-2005006433 A3 | 1/2005 | |

* cited by examiner

*Primary Examiner*—Evan Pert
*Assistant Examiner*—Victor A. Mandala, Jr.
(74) *Attorney, Agent, or Firm*—Blakely, Sokoloff, Taylor & Zafman LLP

(57) ABSTRACT

A molding compound cap structure is disclosed. A process of forming the molding compound cap structure is also disclosed. A microelectronic package is also disclosed that uses the molding compound cap structure. A method of assembling a microelectronic package is also disclosed. A computing system is also disclosed that includes the molding compound cap structure. The molding compound cap includes a configuration that exposes a portion of a microelectronic device.

10 Claims, 6 Drawing Sheets

MOLD COMPOUND CAP IN A FLIP CHIP MULTI-MATRIX ARRAY PACKAGE AND PROCESS OF MAKING SAME

BACKGROUND INFORMATION

1. Technical Field

Disclosed embodiments relate to an article that includes a mounted semiconductor die disposed in a molding compound cap. The molding compound cap exposes a portion of the die.

2. Description of Related Art

An integrated circuit (IC) die is often fabricated into a processor, a digital signal processor (DSP), and other devices for various tasks. The increasing power consumption of such dice results in tighter thermal budgets for a thermal solution design when the die is employed in the field. Accordingly, a thermal interface is often needed to allow the die to reject heat more efficiently. Various solutions have been used to allow the processor to efficiently reject heat.

During the process of encapsulating a microelectronic device, such as a die, in molding compound, the die is often placed inside of a mold, and encapsulation material is injected into the mold cavity. Because of the current molding process, molding compound often "flashes" onto the backside of a die. The flashing phenomenon occurs frequently for a flip-chip configuration where the active surface of the die is presented against a mounting substrate such as a printed wiring board, a mother board, a mezzanine board, an expansion card, or others. The flashing of molding compound upon the back surface of the die creates problems in heat management such that the back surface often must be processed to clean off the flashing of the molding compound.

An article includes a die in a molding compound. Because of thermal cycling of a die in the molding compound, where the molding compound and the backside surface of the die share a co-planar surface, excessive stress is formed at the backside corners of the die. These stresses can damage the die or its package such that a lower fabrication yield can result, or field failures of the article can result.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting of its scope. Some embodiments will be described and explained with additional specificity and detail through the use of the accompanying drawings, in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures are provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
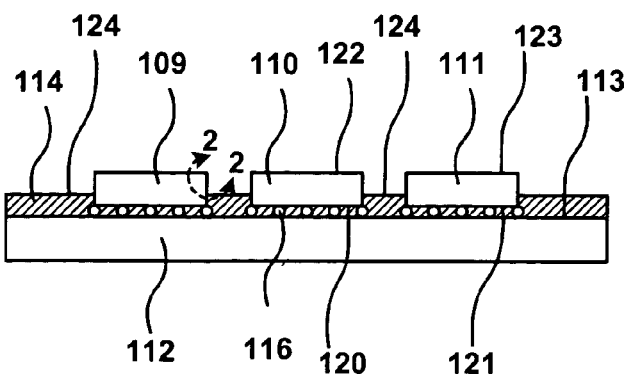
FIG. 1 is a side cross-section of a package according to an embodiment.

FIG. 1 is a side cross-section of a package according to an embodiment. The package includes a first die 110 that is disposed upon a mounting substrate 112. The first die 110 is partially encapsulated in a molding compound cap 114 that abuts the first die 110. The first die 110 is electronically coupled to the mounting substrate 112 through a bump 116 that is, by way of non-limiting example, a metal ball.

The first die 110 includes a first die active first surface 120 and a first die backside second surface 122. One dimension of the article depicted in FIG. 1 includes a die height (DH) that is the vertical difference between the first die backside second surface 122 and the upper surface 113 of the mounting substrate 112. Another parameter of the package, the die-standoff height (DSH), is a measurement of the vertical difference in height between the first die active first surface 120 and the upper surface 113 of the mounting substrate 112. Another parameter of the package depicted in FIG. 1, the molding-compound height (MCH), is a measurement of the vertical difference between the third surface 124 of the molding compound cap 114 and the upper surface 113 of the mounting substrate 112.

FIG. 1 also depicts a second die 111 that is disposed upon the mounting substrate 112. The second die 111 includes a second die active first surface 121 and a second die backside second surface 123. It is also depicted in this embodiment that the molding compound cap 114 abuts the second die 111 as well as the first die 110. In FIG. 1, a last die 109 is also depicted as disposed over the mounting substrate 112 and is likewise abutted by the molding compound cap 114. In the embodiment depicted in FIG. 1, the molding compound cap 114 is continuous and contiguous to the first die 110, the second die 111, and the last die 109.

Figure 2:
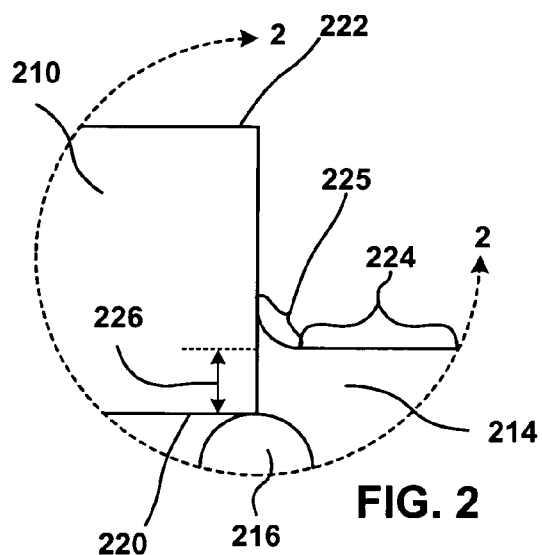
FIG. 2 is a detail section taken along the line 2-2 from FIG. 1 according to an embodiment.

FIG. 2 is a detail section taken along the line 2-2 from FIG. 1 according to an embodiment. A first die 210 is disposed over the mounting substrate 112 (FIG. 1) and is mounted in a molding compound cap 214 similar to the depiction in FIG. 1. Additionally, a bump 216 enables electronic coupling between the first die 210 and the mounting substrate 112. The first die 210 also is illustrated with the first die active first surface 220 and the first die backside second surface 222. The molding compound cap 214 includes a third surface that includes a substantially planar portion 224 and a substantially curvilinear portion (hereinafter "third surface 224, 225) that originates substantially above the first die active first surface 220 and below the first die backside second surface 222. A meniscus 225 portion of the third surface 224, 225 forms a portion of the molding compound cap 214. Accordingly, the meniscus 225 is that portion of the molding compound cap 214 that originates substantially above the first die active first surface 220 and below the first die backside second surface 222.

In the embodiment depicted in FIG. 2, the third surface 224, 225 also has a metric that is a measurement of the distance between the substantially planar portion of the third surface 224 and the first die active first surface 220. This distance is referred to as the molding compound cap encroachment 226. The molding compound cap encroachment 226 can be quantified that portion of the die height that has been covered by the molding compound cap 214, as a percentage of the die height. For example, the molding compound cap encroachment 226 appears to be about 25% of the die height. The die height is the distance between the first die active first surface 220 and the first die backside second surface 222. In any event, the molding compound cap encroachment 226 is a fraction of the total die height.

Figure 3:
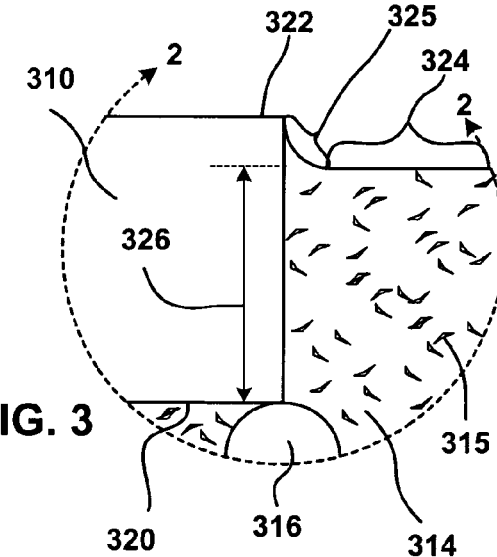
FIG. 3 is a detail section taken along the line 2-2 from FIG. 1 according to an embodiment.

FIG. 3 is a detail section that can be taken along the line 2-2 from FIG. 1 according to an embodiment. A first die 310 is disposed over a mounting substrate (not pictured) and is mounted in a molding compound cap 314 similar to the depiction in FIG. 1. Additionally, a bump 316 enables electronic coupling between the first die 310 and the mounting substrate (not pictured). The first die 310 also is illustrated with the first die active first surface 320 and the first die backside second surface 322. The molding compound cap 314 includes a third surface 324, 325 that originates substantially above the first die active first surface 320 and below the first die backside second surface 322. A meniscus 325 forms a portion of the molding compound cap 314. Accordingly, the meniscus 325 is that portion of the molding compound cap 314 that originates substantially above the first die active first surface 320 and below the first die backside second surface 322.

In the embodiment depicted in FIG. 3, the third surface 324, 325 also has the molding compound cap encroachment 326 metric. In FIG. 3, the molding compound cap encroachment 326 appears to be about 80% of the die height.

In one embodiment, a particulate material 315 is interspersed with the molding compound cap 314. In one embodiment, the particulate material 315 is a graphite fiber. In one embodiment, the particulate material 315 is a diamond powder. In one embodiment, the particulate material 315 is a silica filler. In one embodiment, the the particulate material 315 includes inorganics that are metallic in an organic matrix of the molding compound cap 314. In this embodiment, the overall coefficient of thermal conductivity for the molding compound cap 314 and the particulate material 315 is in a range from about 0.1 W/m-K to less than or equal to about 600 W/m-K. In one embodiment, the particulate material 315 includes inorganics that are dielectrics in an organic matrix of the molding compound cap 314. In this embodiment, the overall coefficient of thermal conductivity for the molding compound cap 314 and the particulate material 315 is in a range from about 10 W/m-K to about 90 W/m-K.

Although the particulate material 315 is depicted as angular and eccentric shapes, in one embodiment, the particulate material 315 can be other shapes. In one embodiment, the particulate material 315 is a substantially spherical powder that has an average diameter in a range from about 0.1 micron to about 100 micron. In one embodiment, the eccentricity of the particulate material 315, as measured by a ratio of the major diagonal axis to the minor diagonal axis, is in a range from about 1 to about 10. In one embodiment, the eccentricity is greater than 10.

It can now be appreciated that the particulate material 315 that appears in the embodiments depicted in FIG. 3 can be present in any embodiment of a molding compound cap as set forth in this disclosure.

Figure 4:
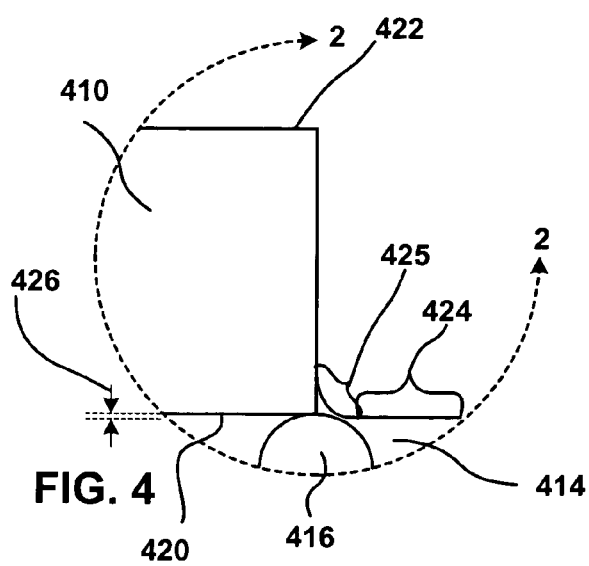
FIG. 4 is a detail section taken along the line 2-2 from FIG. 1 according to an embodiment.

FIG. 4 is a detail section that can be taken along the line 2-2 from FIG. 1 according to an embodiment. A first die 410 is disposed over a mounting substrate (not pictured) and is mounted in a molding compound cap 414 similar to the depiction in FIG. 1. Additionally, a bump 416 enables electronic coupling between the first die 410 and the mounting substrate (not pictured). The first die 410 also is illustrated with the first die active first surface 420 and the first die backside second surface 422. The molding compound cap 414 includes a third surface 424, 425 that originates substantially above the first die active first surface 420 and below the first die backside second surface 422. A meniscus 425 portion of the third surface 424, 425 forms a portion of the molding compound cap 414. Accordingly, the meniscus 425 is that portion of the molding compound cap 414 that originates substantially above the first die active first surface 420 and below the first die backside second surface 422.

In the embodiment depicted in FIG. 4, the third surface 424, 425 also has the molding compound cap encroachment 426 metric. In FIG. 4, the molding compound cap encroachment 426 appears to be a negligible amount of the die height. The substantially planar portion 424 of the third surface 424, 425 is substantially co-planar with the first die active first surface 420. The meniscus 425, however, originates at a position that is substantially above the first die active first surface 420 and below the first die backside second surface 422.

By review of FIGS. 2, 3, and 4, the molding compound cap encroachments 226, 326, and 426, respectively, are depicted as about 25%, 80%, and 0%. Any percentage of the die height, however, is contemplated as an embodiment, so long as the percentage is a fraction of 100% including zero percent.

Figure 5:
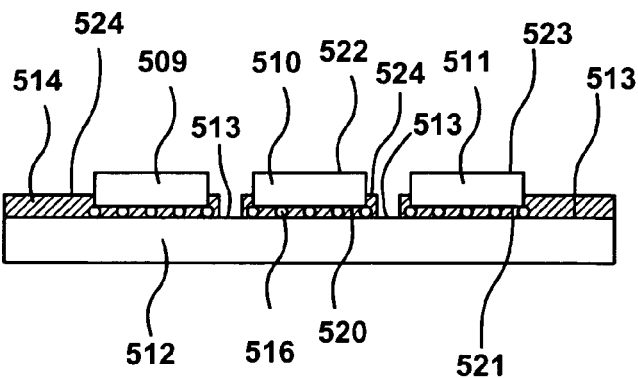
FIG. 5 is a side cross-section of a package according to an embodiment.

FIG. 5 is a side cross-section of a package according to an embodiment. A first die 510 is disposed upon a mounting substrate 512, and a molding compound cap 514 abuts the first die 510. A bump 516 couples the first die 510 to the mounting substrate 512. The first die 510 includes a first die active first surface 520 and a first die backside second surface 522.

The molding compound cap 514 includes a third surface 524 that originates substantially above the first die active first surface 520 and below the first die backside second surface 522. Additionally, the molding compound cap 514 is segmented as depicted in FIG. 5 such that it exposes the mounting substrate 512 by revealing an upper surface 513 of the mounting substrate 512. In addition to the first die 510, FIG. 5 depicts a second die 511 that is disposed upon the mounting substrate 512 and includes a second die active first surface 521 and a second die backside second surface 523. The molding compound cap 514, although segmented, also abuts the second die. As depicted in FIG. 5, the upper surface 513 of the mounting substrate 512 is exposed because of the segmentation of the molding compound cap 514. In any event, the molding compound cap 514 includes a third surface 524 that originates substantially above the respective active first surfaces 520, 521 of the first and second dice and below the respective backside second surfaces 522, 523 of the first and second dice. In FIG. 5, a last die 509 is also depicted as disposed over the mounting substrate 512 and is likewise abutted by the molding compound cap 514. In the embodiment depicted in FIG. 5, the molding compound cap 514 is segmented, but each portion of the segmented molding compound cap 514 is substantially contiguous to the first die 510, the second die 511, and the last die 509.

Figure 6:
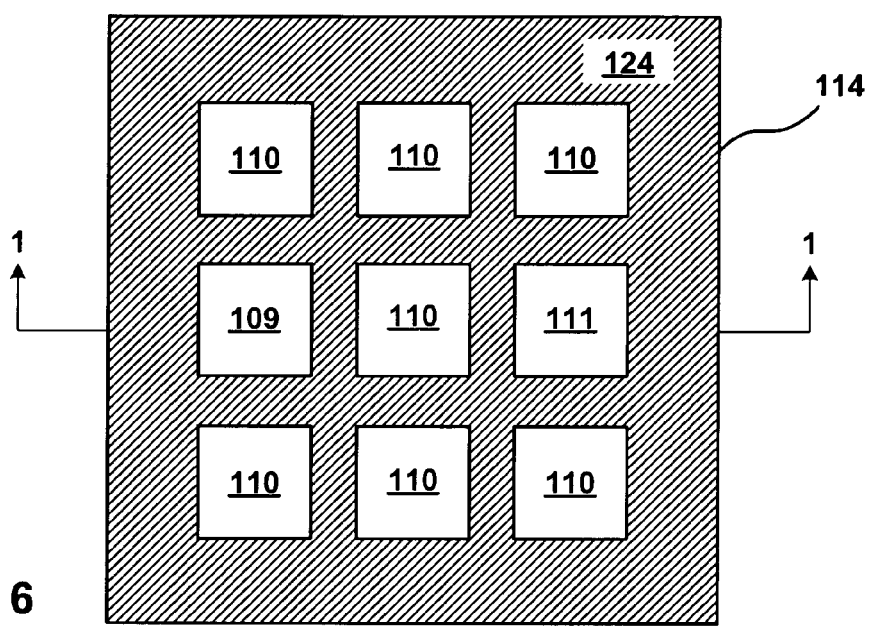
FIG. 6 is a top plan of the package depicted in FIG. 1 according to an embodiment.

FIG. 6 is a top plan view of the package depicted in FIG. 1 according to an embodiment. FIG. 6 represents in one embodiment a multi-matrix array package according to an embodiment. A plurality of dice includes a first die 110, a second die 111, and a last die 109. In an embodiment, the first die 110, the second die 111, and the last die 109 represent multiple occurrences of the same die. As depicted in FIG. 6, the molding compound cap 114 abuts all of the dice as depicted.

Figure 7:
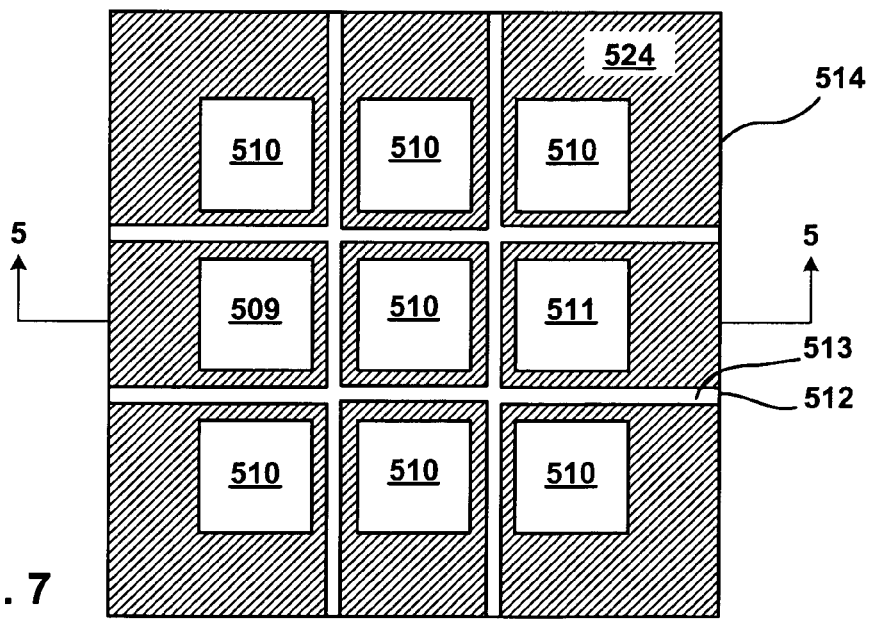
FIG. 7 is a top plan of the package depicted in FIG. 5 according to an embodiment.

FIG. 7 is a top plan view of the package depicted in FIG. 5 according to an embodiment. FIG. 7 represents in one embodiment a multi-matrix array package according to an embodiment. A plurality of dice includes a first die 510, a second die 511, and a last die 509. In an embodiment, the first die 510, the second die 511, and the last die 509 represent multiple occurrences of the same die. As depicted in FIG. 7, the molding compound cap 514 abuts all of the dice as depicted. Additionally, the mounting substrate 512 is exposed at its upper surface 513 because of the segmentation of the molding compound cap 514. Additionally, the third surface 524, that is the upper surface of the molding compound cap 514, is depicted in FIG. 7. In the embodiment depicted in FIG. 7, each occurrence of a die, whether it is the first die 510, the second die 511, or the last die 509, is segmented in a discrete unit separate from each other die and its accompanying occurrence of abutting molding compound cap 514.

Figure 8:
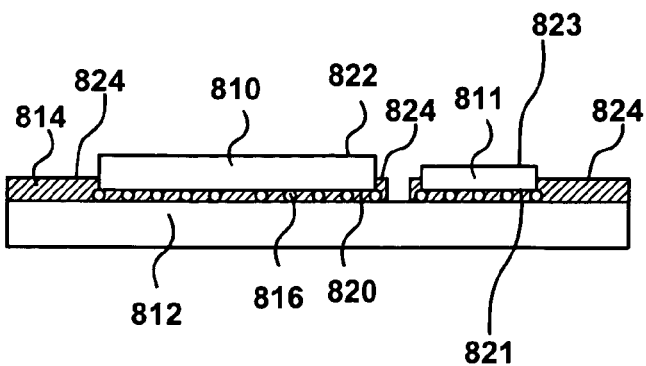
FIG. 8 is a side cross-section of a package according to an embodiment.

FIG. 8 is a side cross-section of a package according to an embodiment. A first die 810 is disposed upon a mounting substrate 812 and is mounted in a molding compound cap 814 that abuts the first die 810. A bump 816 allows the die 810 to be coupled to the mounting substrate 812. The first die 810 includes a first die active first surface 820 and a first die backside second surface 822. The molding compound cap 814 includes a third surface 824 that originates substantially above the first die active first surface 820 and below the first die backside second surface 822. In this embodiment, as in all other embodiments, a meniscus (not depicted) can be present according to the formation of the molding compound cap 814. Accordingly, and as represented in other embodiments in this disclosure, the meniscus is that portion of the molding compound cap 814 that originates substantially above the first die active first surface 820 and below the first die backside second surface 822.

FIG. 8 also depicts a second die 811 that is disposed above mounting substrate 812 and is embedded in the molding compound cap 814. The second die 811 includes a second die active first surface 821 and a second die backside second surface 823. Although the first die 810 and the second die 811 are of different sizes and shapes, the mounting scheme of this embodiment includes an exposed portion of the upper surface 813 of the mounting substrate 812 by discrete segmentation of the molding compound cap 814.

An embodiment of a plurality of dice that are of different shapes and sizes includes a single molding compound cap that is not segmented. This embodiment can be realized, for example in FIG. 1, by removing the dice 109, 110, 111, and by replacing them with the dice 810, 811 from FIG. 8.

Figure 9:
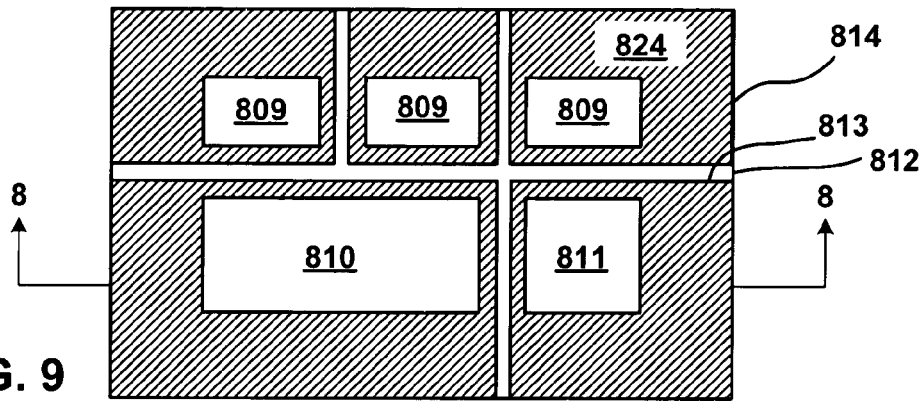
FIG. 9 is a top plan of the package depicted in FIG. 8 according to an embodiment.

FIG. 9 is a top plan view of the package depicted in FIG. 8 according to an embodiment. FIG. 9 represents in one embodiment a multi-matrix array package according to an embodiment. A plurality of dice includes the first die 810, the second die 811, and the last die 809. In an embodiment, the first die 810, the second die 811, and the last die 809 represent multiple occurrences of the same die. As depicted in FIG. 9, the molding compound cap 814 abuts all of the dice as depicted.

FIG. 9 also depicts the mounting substrate 812 and shows that the upper surface 813 of the mounting substrate 812 is exposed between discrete segments of the molding compound cap 814. Additionally, the third surface 824, that is the upper surface of the molding compound cap 814, is depicted in FIG. 9. In the embodiment depicted in FIG. 9, each occurrence of a die, whether it is the first die 810, the second die 811, or the last die 809, is segmented in a discrete unit separate from each other die and its accompanying occurrence of abutting molding compound cap 814.

In one embodiment, the chip package depicted in FIG. 9, can include a main die such as a processor 810 that can be an application-specific integrated circuit (ASIC) and the second die 811 can be a specialized die such as a telecommunications and/or graphics device. By way of non-limiting example, the last die 809 as depicted in FIG. 9 can be at least one memory device. In one embodiment, the chip package depicted in FIG. 9 represents a wireless device technology such as a telephone, a personal data assistant, a personal computer, or a combination of two of the aforementioned devices.

Although the first die 810 and the second die 811 are depicted as having different die heights in FIG. 8, one can read this disclosure and understand that one embodiment includes the first die 810 and the second die 811 having substantially equal heights. In one embodiment, the DH can be the same for the first die 810 and the second die 811, but the DSH of each can be different.

Figure 10:
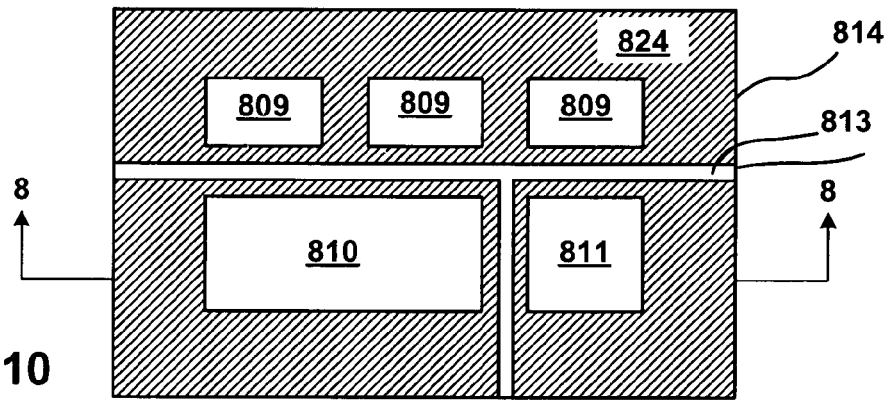
FIG. 10 is a top plan of the package depicted in FIG. 8 according to an alternative embodiment.

FIG. 10 is a top plan view of the package depicted in FIG. 8 according to an alternative embodiment. FIG. 10 represents in one embodiment a multi-matrix array package according to an embodiment. A plurality of dice includes a first die 810, a second die 811, and a last die 809. In an embodiment, the first die 810, the second die 811, and the last die 809 represent multiple occurrences of the same die. As depicted in FIG. 10, the molding compound cap 814 abuts all of the dice as depicted.

FIG. 10 also depicts the mounting substrate 812 and shows that the upper surface 813 of the mounting substrate 812 is exposed between discrete segments of the molding compound cap 814. Additionally, the third surface 824, that is the upper surface of the molding compound cap 814, is depicted in FIG. 10. In the embodiment depicted in FIG. 10, each occurrence of a die, whether it is the first die 810, the second die 811, or the last die 809, is segmented in a discrete unit separate from each other die and its accompanying occurrence of abutting molding compound cap 814.

In one embodiment, the chip package depicted in FIG. 10, can include a main die such as a processor 810 that can be an application-specific integrated circuit (ASIC) and the second die 811 can be a specialized die such as a telecommunications and/or graphics device. By way of non-limiting example, the last die 809 as depicted in FIG. 10 can be at least one memory device. In one embodiment, the chip package depicted in FIG. 10 represents a wireless device technology such as a telephone, a personal data assistant, a personal computer, or a combination of two of the aforementioned devices.

Although the first die 810 and the second die 811 are depicted as having different die heights in FIG. 8, one can read this disclosure and understand that one embodiment includes the first die 810 and the second die 811 having substantially equal heights. In one embodiment, the DH can be the same for the first die 810 and the second die 811, but the DSH of each can be different.

In FIG. 10, all of last dice 809 are encapsulated according to an embodiment in a single discrete occurrence of the molding compound cap 814. In this embodiment, however, the first die 810 is discretely disposed in a separate occurrence of the molding compound cap 814. Likewise, the second die 811 is discretely disposed in a separate occurrence of the molding compound cap 814. One embodiment (not pictured) includes the configuration where all of last dice 809 are encapsulated together according to an embodiment in a single discrete occurrence of the molding compound cap 814, and where the first die 810 and the second die 811 are discretely encapsulated separate from the last dice 809, but the first die 810 and the second die 811 are encapsulated together in the molding compound cap 814.

Figure 11:
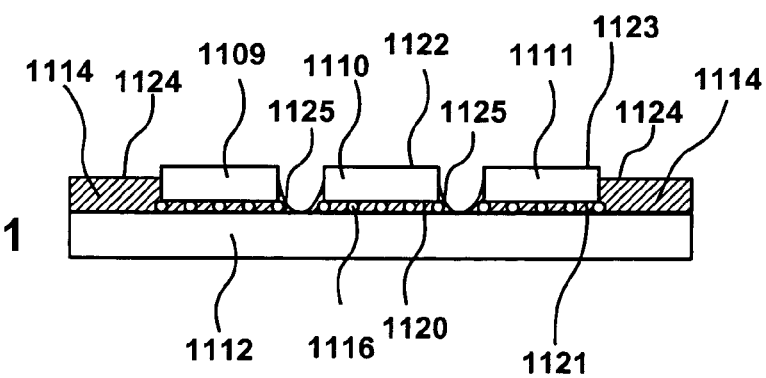
FIG. 11 is a side cross-section of a package according to an embodiment.

FIG. 11 is a side-cross section of a package according to an embodiment. A first die 1110 is disposed upon a mounting substrate 1112 and is encapsulated in a molding compound cap 1114 that abuts the first die 1110. The first die 1110 is coupled to the mounting substrate 1112 through a bump 1116. The first die 1110 includes a first die active first surface 1120 and a first die backside second surface 1122. In FIG. 11, the molding compound cap 1114 includes a substantially rectangular profile near the lateral edges of the package. Accordingly, the third surface 1124 is substantially planar.

FIG. 11 also depicts a second die 1111 and a last die 1109. The second die 1111 includes a second die active first surface 1121 and a second die backside second surface 1123. Between the first die 1110 and the second die 1111 the molding compound 1114 includes a fourth surface 1125 that is substantially curvilinear. The molding compound cap 1114 between the first die 1110 and the second die 1111 originates at each die substantially above the respective first and second die active first surfaces 1120, 1121 and below the respective first and second die backside second surfaces 1122 and 1123. A meniscus (not pictured) according to the various embodiments set forth in this disclosure, abuts the outer edges of the second die 1111 and the last die 1109.

Figure 12:
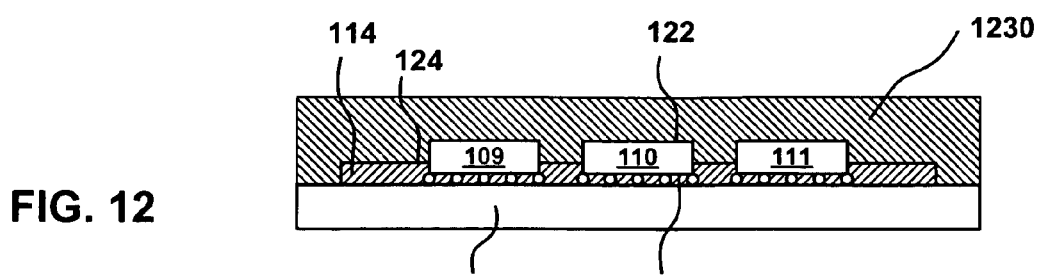
FIG. 12 is a side cross-section of the package depicted in FIG. 1 during processing according to an embodiment.

FIG. 12 is a side cross-section of a package such as the package depicted in FIG. 1 during processing according to an embodiment. During processing, the molding compound cap 114 is injected into the package between a mold chase 1230 and the mounting substrate 112. In this embodiment, the mold chase 1230 is depicted as having a vertical profile that complements the profiles of the first die 110, the second die 111, and the last die 109 if more than one last die 109 is present. According to this embodiment, the problem of flashing, the phenomenon of molding compound leaking onto the backside second surface of the dice, is eliminated due to the vertical profile of the mold chase 1230.

In one embodiment, processing includes injection molding or transfer molding with particulate fillers as set forth in this disclosure. In one embodiment, processing includes injection molding followed by in situ thermal curing or thermal partial curing by application of heat through the mold chase 1230. After processing, the mold chase 1230 is removed, and the package substantially as it is depicted in FIGS. 1-4 results according to various embodiments.

Figure 13:
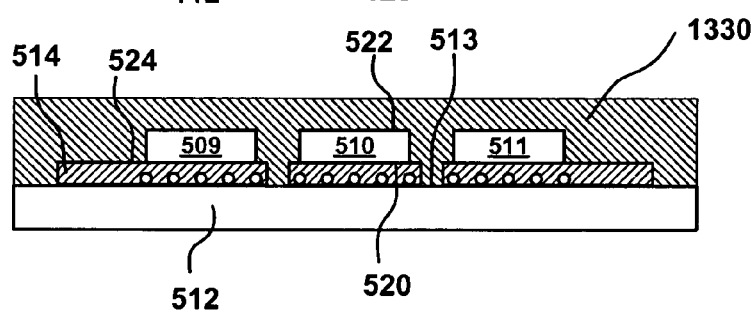
FIG. 13 is a side cross-section of the package depicted in FIG. 5 during processing according to an embodiment.

FIG. 13 is a side cross-section of the package depicted in FIG. 5 during processing according to an embodiment. During processing, the molding compound cap 514 is injected into the package between a mold chase 1330 and the mounting substrate 512. In this embodiment, the mold chase 1330 is depicted as having a vertical profile that complements the profiles of the first die 510, the second die 511, and the last die 509 if more than one last die 509 is present. Additionally, the profile of the mold chase 1330 leaves a portion of the upper surface 513 exposed. According to this embodiment, the problem of flashing is eliminated due to the vertical profile of the mold chase 1330.

In one embodiment, processing includes injection molding or transfer molding with particulate fillers as set forth in this disclosure. In one embodiment, processing includes injection molding followed by thermal curing or thermal partial curing by application of heat through the mold chase 1330. After processing, the mold chase 1330 is removed, and the package substantially as it is depicted in FIG. 5 results according to various embodiments. The mold chase 1330 includes in its vertical profile, a portion that substantially touches the upper surface 513 of the mounting substrate 512. Accordingly, an exposed portion of the mounting substrate 512 and discrete segments of the molding compound cap 514 is the result when the mold chase is removed as is depicted in FIG. 5.

Figure 14:
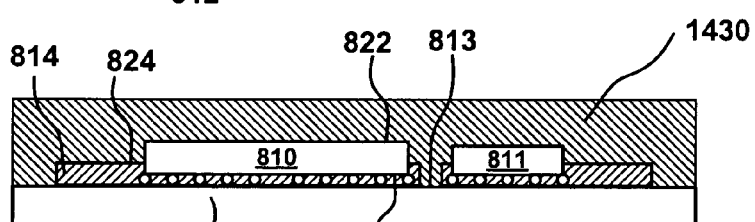
FIG. 14 is a side cross-section of the package depicted in FIG. 8 during processing according to an embodiment.

FIG. 14 is a side cross-section of the package depicted in FIG. 8 during processing according to an embodiment. During processing, the molding compound cap 814 is injected into the package between a mold chase 1430 and the mounting substrate 812. In this embodiment, the mold chase 1430 is depicted as having a vertical profile that complements the profiles of the first die 810, the second die 811, and the last die 809 if more than one last die 809 is present. According to this embodiment, the problem of flashing is eliminated due to the vertical profile of the mold chase 1430. After processing, the mold chase 1430 is removed, and the package substantially as it is depicted in FIG. 8 results according to an embodiment. The mold chase 1430 includes in its vertical profile, a portion that substantially touches the upper surface 813 of the mounting substrate 812. Accordingly, an exposed portion of the mounting substrate 812 and discrete segments of the molding compound cap 814 is the result when the mold chase 1430 is removed as is depicted in FIG. 8.

Figure 15:
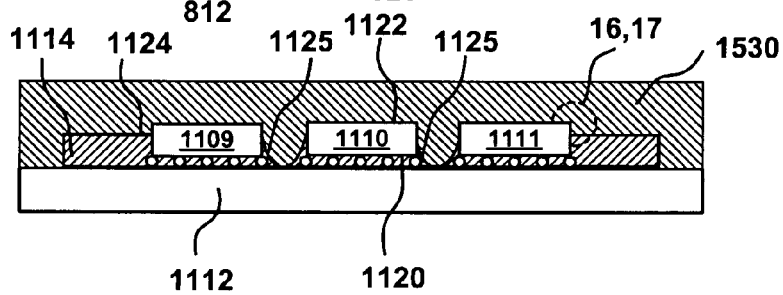
FIG. 15 is a side cross-section of the package depicted in FIG. 11 during processing according to an embodiment.

FIG. 15 is a side cross-section of the package depicted in FIG. 11 during processing according to an embodiment. During processing, the molding compound cap 1114 is injected into the package between a mold chase 1530 and the mounting substrate 1112. In this embodiment, the mold chase 1530 is depicted as having a vertical profile that complements the profiles of the first die 1110, the second die 1111, and the last die 1109. According to this embodiment, the problem of flashing is eliminated due to the vertical profile of the mold chase 1530. After processing, the mold chase 1530 is removed, and the package substantially as it is depicted in FIG. 11 results according to an embodiment. The mold chase 1530 includes in its vertical profile, a portion that has imposed the curvilinear profile 1125 (FIG. 11) that approaches the upper surface 1113 of the mounting substrate 1112. Accordingly, an exposed portion of the mounting substrate 1112 will be the result when the mold chase is removed as is depicted in FIG. 11.

The mold chase 1530 imposes both a rectangular profile upon the molding compound cap 1114 at the edges of the package and a curvilinear profile 1125 of the molding compound cap 1114 between the occurrence of the first die 1110 and the second die 1111 as well as between the first die 1110 and the last die 1109. According to an embodiment, it can be understood that the profile of the molding compound cap 1114 includes both a substantially planar surface and a meniscus. In one embodiment, the substantially planar surface and meniscus include an upper surface 1124 as depicted in FIG. 11, and as depicted in more detail in FIGS. 2-4. In one embodiment, the meniscus includes the curvilinear surface 1125 as depicted in FIG. 11. In any event, the meniscus is that portion of the molding compound cap 1114 that originates substantially above the first die active first surface 1120 and below the first die backside second surface 1122.

Figure 16:
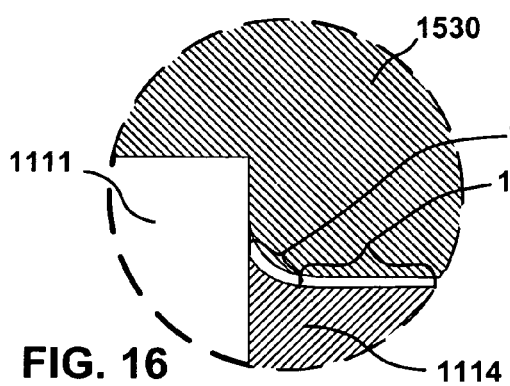
FIG. 16 is a detail section taken from FIG. 15 according to an embodiment.

FIG. 16 is a detail section taken from FIG. 15 according to an embodiment. The second die 1111 is depicted along with the mold chase 1530 and the molding compound cap 1114. The meniscus 1125 of the third surface 1124 has been imposed by the shape of the mold chase 1530 where it abuts a lateral surface of the second die 1111. In this embodiment, it is understood, that the meniscus 1125 is an "imposed meniscus." The meniscus 1125 is imposed by the shape of the mold chase 1530 where it abuts the edge of the second die 1111.

Figure 17:
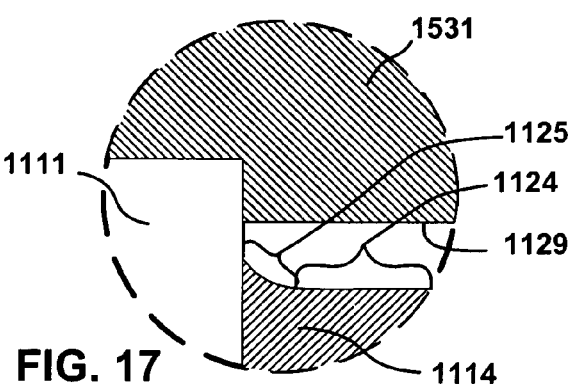
FIG. 17 is a detail section taken from FIG. 15 according to an alternative embodiment.

FIG. 17 is a detail section taken from FIG. 15 according to an alternative embodiment. The second die 1111 has been over-molded by a mold chase 1531 that has a substantially planar lower profile 1129. The occurrence of the meniscus 1125, however, exists because of the wetting quality of the material of the molding compound cap 1114. As the mold chase 1531 is lifted away from the package, or otherwise during the molding process, the meniscus 1125 forms by capillary action. Accordingly, the third surface 1124 and 1125 include a substantially planar surface 1124 and curvilinear surface 1125. In this embodiment, the meniscus 1125 is referred to as a "capillary action meniscus."

Figure 18:
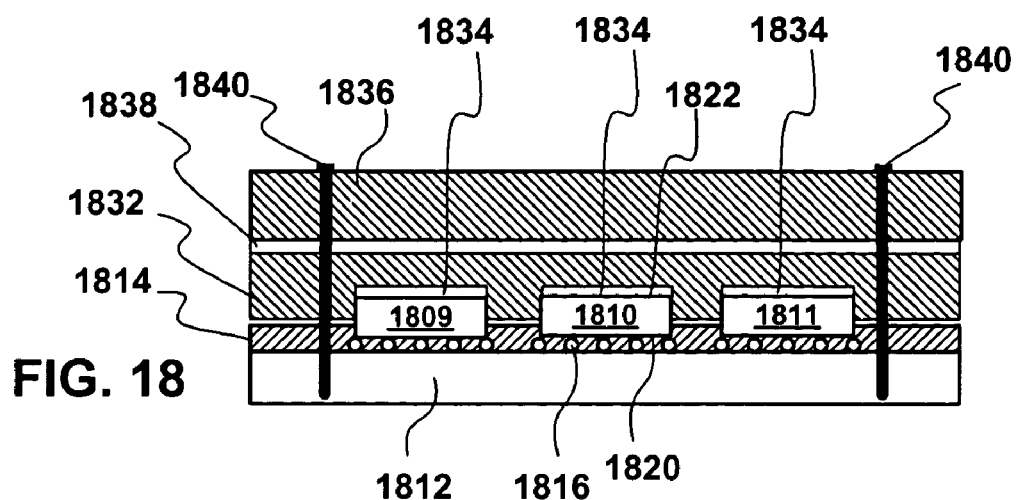
FIG. 18 is a side cross-section of a package according to an embodiment.

FIG. 18 is a side cross-section of a package according to an embodiment. A first die 1810 is disposed upon a mounting substrate 1812 according to many of the various embodiments set forth in this disclosure. A second die 1811 is disposed upon the mounting substrate 1812 next to the first die 1810. Similarly, a last die 1809 is disposed upon the mounting substrate 1812 next to the first die. A molding compound cap 1814 is depicted abutting the respective dice 1810, 1811 and 1809. The embodiment of the molding compound cap 1814 has the appearance of the embodiment of the molding compound cap 114 depicted in FIG. 1. The molding compound cap 1814, however, should be understood to include but not be limited to other embodiments. Examples include but are not limited to the molding compound cap 514 depicted in FIG. 5, the molding compound cap 814 depicted in FIG. 8, and the molding compound cap 1114 depicted in FIG. 11. Other embodiments include but are not limited to the plan view embodiments depicted in this disclosure. By reading this disclosure, one of ordinary skill in the art can understand other configurations of a molding compound cap in a package according to an embodiment.

A heat spreader 1832 is disposed over the dice 1810, 1811, and 1809. The heat spreader 1832 is set upon the back side second surfaces of the dice 1810, 1811, and 1809 and bonded with a thermal interface material (TIM) 1834. The heat spreader 1832 along with the TIM 1834, represent a thermal solution referred to as "TIM 1." In one embodiment, the TIM 1838 and the heat spreader 1832 are referred to as an "enabling solution" that can have a stand-alone commercial applicability. In one embodiment, the TIM 1834 is indium (In). In one embodiment, the TIM 1834 is an indium-tin (InSn) alloy. In one embodiment, the TIM 1834 is an indium-silver (InAg) alloy. In one embodiment, the TIM 1834 is a tin-silver (SnAg) alloy. In one embodiment, the TIM 1834 is a tin-silver-copper (SnAgCu) alloy. In one embodiment, the TIM 1834 is a thermally conductive polymer.

Disposed above the heat spreader 1832 is a heat sink 1836. The heat sink 1836 is bonded to the heat spreader 1832 with a TIM 1838. The additional heat sink 1836 and the TIM 1838 are referred to as an enabling solution that can have a commercial applicability as what is referred to as "TIM 2." The heat sink 1836 is depicted generically as a heat slug. The heat sink 1836, however, can be any type of heat sink according to a specific application need, including a heat pipe, a fan, a skived heat sink, or others. In one embodiment, the heat sink 1836 is bolted or otherwise fastened to the heat spreader 1832 and optionally to the mounting substrate 1812 by a fastener 1840. The fastener can be any type of connector such as a bolt, a screw, a nail, or others.

Figure 19:
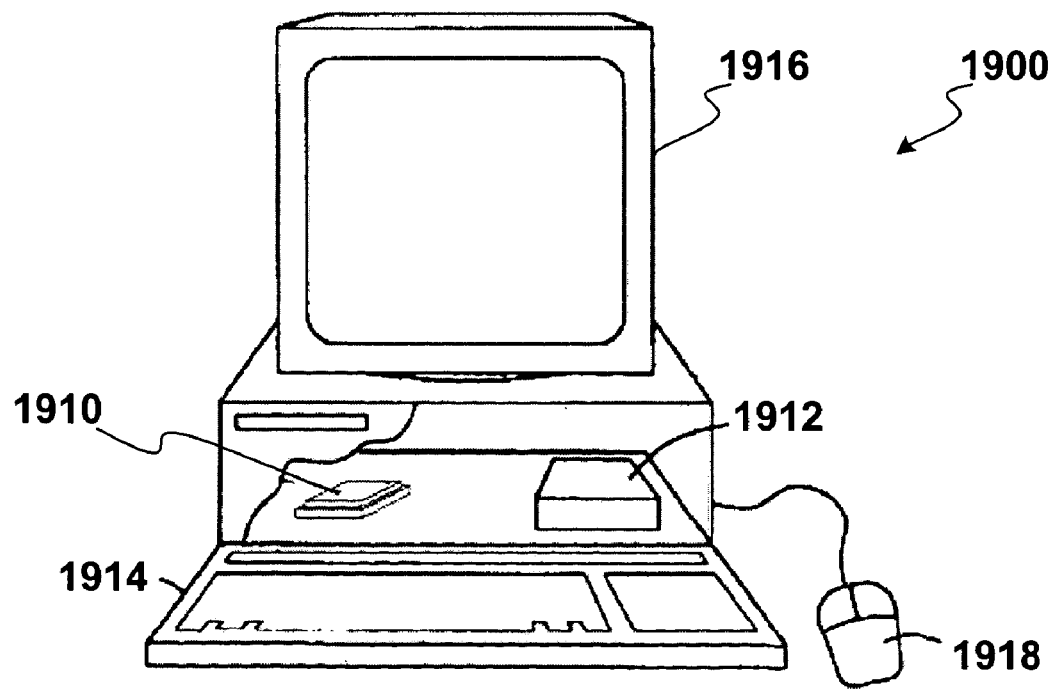
FIG. 19 is a depiction of a computing system according to an embodiment.

FIG. 19 is a depiction of a computing system 1900 according to an embodiment. One or more of the foregoing embodiments that includes a molding compound cap as disclosed herein may be utilized in a computing system, such as a computing system 1900 of FIG. 19. The computing system 1900 includes at least one die (not pictured), which is enclosed in a microelectronic device package 1910, a data storage system 1912, at least one input device such as a keyboard 1914, and at least one output device such as a monitor 1916, for example. The computing system 1900 includes a die that processes data signals such as a microprocessor, available from Intel Corporation. In addition to the keyboard 1914, the computing system 1900 can include another user input device such as a mouse 1918, for example.

For the purposes of this disclosure, a computing system 1900 embodying components in accordance with the claimed subject matter may include any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

Embodiments set forth in this disclosure can be applied to devices and apparatuses other than a computing system of a traditional computer. For example, a die can be packaged with an embodiment of the molding compound cap and placed in a portable device such as a wireless communicator or a hand-held such as a personal data assistant and the like. Another example is a die that can be packaged with an embodiment of the molding compound cap and placed in a vehicle such as an automobile, a locomotive, a watercraft, an aircraft, or a spacecraft.

Figure 20:
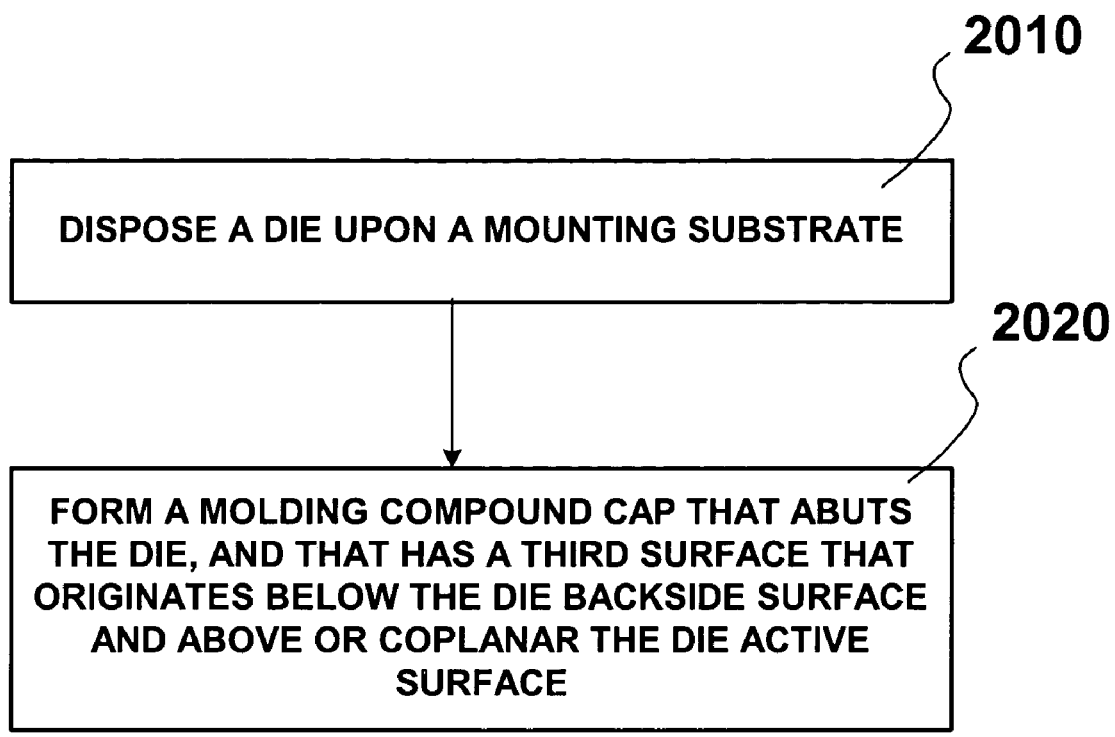
FIG. 20 is a process flow diagram according to various embodiments.

FIG. 20 is a process flow diagram according to various embodiments. At 2010, a die is disposed upon a mounting substrate. At 2020, the molding compound cap is formed abutting the die. Forming the molding compound cap includes forming a highest surface that is above the active surface and below the backside surface. In one embodiment, the process can proceed by injection molding. In one embodiment, the process can proceed by injection molding a molding compound cap, followed by pick-and-place disposing the molding compound cap over a die followed by optional curing.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A processing system comprising:
a mold chase including a profile that is capable of causing molding cap compound to originate on a die at a die height that is substantially above the die active surface and below the die backside second surface, and that forms a third surface that is substantially parallel planar to the die backside second surface.

2. The processing system according to claim 1, wherein the profile is capable of forming a meniscus where the molding cap compound originates, wherein the meniscus is formed as one selected from a capillary action meniscus and an imposed meniscus.

3. The processing system according to claim 1, wherein the profile is capable of imposing an exposed upper surface upon a mounting substrate at a position between a first die cavity in the mold chase and a second die cavity in the mold chase.

4. The processing system according to claim 1, wherein the profile includes a first die cavity, a second die cavity contiguous the first die cavity, and a last die cavity contiguous the first die cavity,
wherein the first die cavity, the second die cavity, and the last die cavity are arranged in a configuration selected from:
the first die cavity, the second die cavity, and the last die cavity are disposed in a single molding compound cap cavity;
the first die cavity, the second die cavity, and the last die cavity are each disposed in separate molding compound cap cavities;
the first die cavity and the second die cavity are disposed in a single molding compound cap cavity, and at least two occurrences of the last die cavity are disposed in a single molding compound cap cavity; and
the first die cavity and the second die cavity are each disposed in separate molding compound cap cavities, and at least two occurrences of the last die are disposed in a single molding compound cap cavity.

5. A process comprising:
forming a molding compound cap over a first die that is disposed upon a substrate, wherein the first die includes a first die active first surface and a first die backside second surface, and wherein forming the molding compound cap includes forming a molding compound cap third surface that is parallel planar and above the first die active first surface and below the first die backside second surface, and wherein the molding compound cap third surface includes:
a meniscus that originates substantially above the first die active first surface, wherein the meniscus is an imposed meniscus or a capillary action meniscus; and
a substantially planar surface that is parallel planar to the first die active first surface, and parallel planar located above the first die active first surface at a height that is a fraction of the die height.

6. The process according to claim 5, further including:
forming the molding compound cap over a second die that is disposed upon the mounting substrate, wherein the second die includes a second die active first surface and a second die backside second surface, and wherein forming the molding compound cap includes forming the molding compound cap third surface parallel planar and above the second die active first surface and below the second die backside second surface.

7. The process according to claim 5, further including:
forming the molding compound cap over a last die that is disposed upon the mounting substrate, wherein the last die includes a last die active first surface and a last die backside second surface, and wherein forming the molding compound cap includes forming the molding compound cap third surface above the last die active first surface and below the last die backside second surface.

8. The process according to claim 5, wherein forming the molding compound cap includes injection molding the molding compound with a particulate.

9. The process according to claim 5, further including:
forming the molding compound cap over a second die that is disposed upon the mounting substrate, wherein the second die includes a second die active first surface and a second die backside second surface, and wherein forming the molding compound cap includes forming the molding compound cap third surface above the second die active first surface and below the second die backside second surface; and forming the molding compound cap over a last die that is disposed upon the mounting substrate, wherein the last die includes a last die active first surface and a last die backside second surface, and wherein forming the molding compound cap includes forming the molding compound cap third surface above the last die active first surface and below the last die backside second surface.

10. The process according to claim 5, wherein forming the molding compound cap is selected from injection molding, in situ thermal curing, pick-and-place coupling the molding compound cap with the first die, and combinations thereof.

* * * * *